United States Patent [19]

Olofsen et al.

[11] 4,087,133
[45] May 2, 1978

[54] TRANSPORT SYSTEM FOR DISC-SHAPED WORK-PIECES

[75] Inventors: Oluf Per Olofsen; Kaj Sønnik Lund, both of Roskilde; Bent Karlo Jørgensen, Stenlose, all of Denmark

[73] Assignee: Chemical Reactor Equipment A/S, Roskilde, Denmark

[21] Appl. No.: 633,197

[22] Filed: Nov. 19, 1975

[30] Foreign Application Priority Data

Nov. 20, 1974 Denmark .......................... 6040/74

[51] Int. Cl.² .............................................. B65G 51/02
[52] U.S. Cl. .................................. 302/2 R; 271/195; 302/31
[58] Field of Search ............... 302/2 R, 29, 31, 11–13; 271/97, 195, 4, 5; 294/64 B; 214/1 BE

[56] References Cited

U.S. PATENT DOCUMENTS

| | | | |
|---|---|---|---|
| 1,061,526 | 5/1913 | Cortissoz | 271/5 |
| 3,136,539 | 6/1964 | Lyman | 271/195 |
| 3,198,515 | 8/1965 | Pitney | 302/2 R |
| 3,219,340 | 11/1965 | Hori et al. | 271/97 |
| 3,503,607 | 3/1970 | Gluskin | 271/195 |
| 3,504,910 | 4/1970 | Spyropoulos | 271/195 |
| 3,511,495 | 5/1970 | Schonfeld | 271/97 |
| 3,614,168 | 10/1971 | Range | 302/31 |
| 3,717,381 | 2/1973 | Hagler | 302/31 |
| 3,718,371 | 2/1973 | Lasch | 302/31 |
| 3,930,684 | 1/1976 | Lasch et al. | 302/2 R |
| 3,948,564 | 4/1976 | Flint | 302/2 R |
| 4,002,254 | 1/1977 | Olofsen | 302/2 R |

OTHER PUBLICATIONS

IBM Technical Disclosure Bulletin, vol. 16, No. 9, Feb. 1974 by Mack et al.

*Primary Examiner*—Evon C. Blunk
*Assistant Examiner*—Jeffrey V. Nase
*Attorney, Agent, or Firm*—Sughrue, Rothwell, Mion, Zinn and Macpeak

[57] ABSTRACT

A Bernouilli wafer transport system in which semiconductor wafers or similar disc-shaped work-pieces may be transported along rail sections one side of which forms a wafer suspension surface incorporating along its longitudinal symmetry thus the orifices of a number of inclined nozzles connected with a common air or gas duct in the interior of the rail section, said nozzles having an orientation in the desired direction of transportation. A rail section may be constructed in one end to be introduced to a prescribed depth into a wafer supply or receiving magazine and two such rail sections may be combined into a single continuous rail having means for stopping wafer transport in an intermediate position between two magazines. The inclination angle of nozzles relative to a plan to the suspension surfaces may be different for different nozzles along a rail section in order to provide safe control of the unloading and loading of wafers from and into magazines as well as the transportation thereof.

3 Claims, 7 Drawing Figures

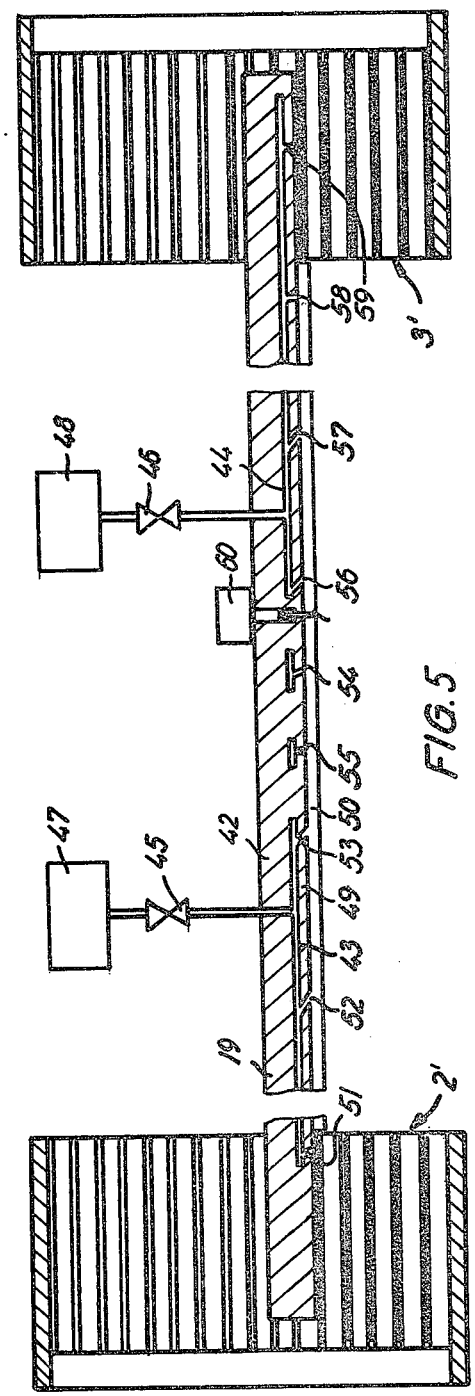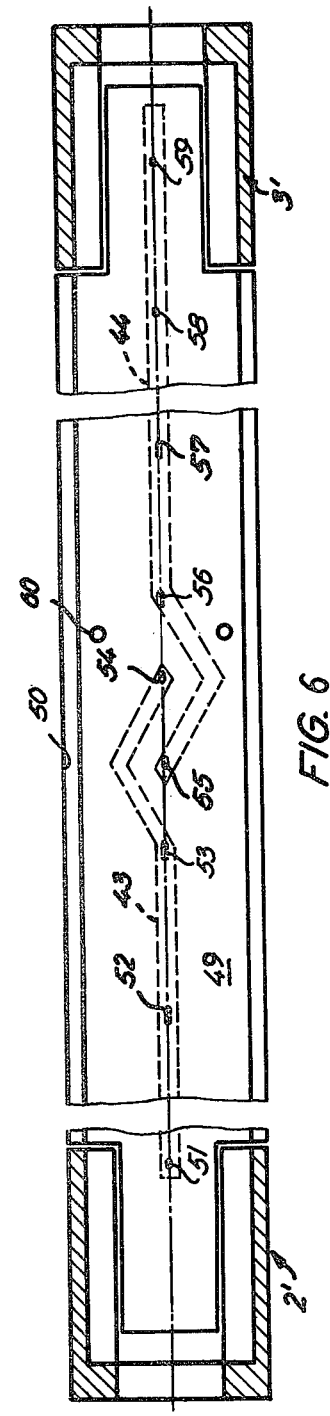
FIG. 5
FIG. 6

TRANSPORT SYSTEM FOR DISC-SHAPED WORK-PIECES

The present invention relates to a system for transporting identical disc-shaped work pieces and, in particular, a system for transporting wafers to be used in semiconductor manufacture without physically contacting said work pieces while making use of the theoretically well known Bernouilli's principle.

In the applicants' U.S. Pat. No. 4,002,254, a method and an apparatus are disclosed for handling work pieces of the above mentioned kind without physically contacting them while making use of said Bernouilli principle, according to which a flat work piece can be attracted to a flat suspension surface by ejecting an air- or gas flow through a nozzle in said suspension surface as a result of the fact that such an air flow when the suspension surface is positioned close to the work piece will spread like a blanket thereover, whereby a low pressure will be created in a narrow space between the work piece and the suspension surface. Thereby, handling or lifting of a work piece from the top side thereof will be possible without any physical contact between the pick-up device and the work piece.

By means of such a pick-up device, which according to the above mentioned patent application is constructed as a manually operated tool designed particularly for use in cooperation with standard magazines for semiconductor wafers, considerable advantages are obtained relative to known methods and devices, such as tweezers or tongs, conventionally used for handling semiconductor wafers which are very vulnerable. Above all a considerable reduction of the relatively great production loss which is almost inevitable in the prior art technology is obtained.

It is the object of the present invention to provide by a further development of the particular feature of the pick-up device disclosed in the above mentioned patent application that the air- or gas nozzle shall form a prescribed inclination angle to the plane of the suspension surface in order to be able to force the work piece to be handled to abut against stop means protruding from the suspension surface, a system for transporting work pieces of the kind referred to without any manual operation of pick-up devices and, particularly, for unloading and loading work pieces from and into standard magazines.

According to an article in IBM Technical Disclosure Bulletin, Vol. 16, No. 9, February 1974, page 2906, it has already been attempted to construct such wafer transport systems operating on the basis of the Bernouilli principle. However, none of these attempts has resulted in a transport system which has been applicable in practice, mainly due to the fact that only transportation of wafers between flat supporting surfaces above which a transport rail could be positioned without hindrance has been possible by such systems. Furthermore, it has appeared that it is difficult to obtain a sufficient control of the wafer movement which is completely without any friction.

Hitherto, no transport system has been suggested, by which the most frequent need of wafer transport in semiconductor manufacture can be satisfied, i.e. the unloading of such wafers from a magazine for positioning in a process station, and the reloading into a magazine subsequent to a process step carried out in such a process station.

According to the invention, a system for transporting identical disc-shaped work pieces is provided and, in particular, a system for transporting wafers to be used in semiconductor manufacture without physical contact while making use of Bernouilli's principle, said system comprising at least one rail section extending in a desired direction of transportation and having a substantially flat suspension surface limited by lateral guide means for guiding the movement of said work pieces, a longitudinal duct formed inside said rail section, an air- or gas source connected with said duct and a number of inclined air- or gas ejection nozzles extending between said duct and acid suspension surface, the orifices of said nozzles being positioned substantially along the longitudinal symmetry line of said suspension surface, and the axes of said nozzles having an orientation in said direction of transportation, at least one rail section being formed in one end thereof without said lateral guide means on part of its length for introduction to a prescribed depth into an open front magazine, in which said work pieces are positioned in individual tracks.

Thereby, an unlimited number of alternative possibilities are obtained for building up automatical systems for the internal transport of semiconductor wafers in the manufacture thereof. As a practical example, reference may be made to the unloading of wafers from a standard magazine onto a flat supporting surface in a process station, the wafers being positioned on said supporting surface with the vulnerable surface, which may be coated with a thin film and is to be subjected to a physical or chemical treatment, facing upwardsly to be directly accessible to the desired treatment, and the reloading of the wafers subsequent to such treatment into another magazine.

By this considerable improvement of the mechanical handling and transport of wafers, which have constituted, so as to say, a bottle-neck in the conventional production of semiconductors, this production is made essentially simpler and more inexpensive. Moreover, a particular advantage is obtained in that in an automatical transport system constructed in accordance with the invention, there will be no need of taking particular measures when wafers are to be positioned in process stations, in which physical conditions prevail, such as very high temperatures, whereby manual wafer positioning in such a process station is in practice made very difficult, or even impossible.

Thus, by means of a rail section according to the invention, wafers can be unloaded from a magazine and positioned on a movable supporting surface in the form of a conveyor belt or carriage, by means of which the wafers are carried into the process station, so that by the additional use of an indexing mechanism of a kind known per se to provide relative movement between the magazine and the rail section, a continuous transport of wafers from the magazine to the process station can be realized. After passage of the movable supporting surface through the process station, the wafers may again be taken off from the supporting surface in order of succession and reloaded into a receiving magazine by means of another rail section and a corresponding indexing mechanism to provide relative movement between said rail section and the receiving magazine.

In a rail section intended to unload wafers from a magazine positioned at one end of said rail section, the axes of the ejection nozzles will according to the invention have an orientation towards the opposite end of the rail section, and the mutual spacings between the nozzles orifices in the suspension surface as well as the distance from said one end of the rail section to the nearest nozzle orifice may advantageously be proportioned such that only one nozzle will be positioned opposite a wafer in the magazine when introducing said one end of the rail section thereinto.

According to a further aspect of the invention, it will be advantageous in order to secure that a wafer is not unloaded from the magazine until the foregoing wafer has been completely removed from the magazine that the inclination angle between the axis of said one nozzle and a normal to the plane of the suspension surface is proportioned such that only the wafer closest to the suspension surface will be influenced by the air- or gas flow ejected through said nozzle in a region of a prescribed minimum area at the circumference of the work piece closest to the open front of the magazine, when the rail section is introduced into the magazine with the prescribed clearance between the suspension surface and said work piece.

Correspondingly, in a rail section intended for loading wafers into a magazine positioned at one end of the rail section, the axes of the ejection nozzles will have an orientation towards said one end of the rail section.

According to a still further aspect of the invention, it may be advantageous in such a rail section in order to avoid too great velocities of the wafers when entering into the magazine and secure a wafer to be positioned in coplanar relationship to a track in the magazine before entrance that the inclination angle between the axis of at least the nozzle closest to said one end of the rail section and a normal to the plane of the suspension surface is at least 5° and at the most 15°, whereas the spacing between the orifices of said nozzle and the succeeding nozzle in the direction from said one end is at least 65 percent and at the most 80° percent of the cros-sectional dimension of the wafers to be transported.

In the following, the invention will be explained in further detail with reference to the accompanying schematical drawings, in which FIG. 1 is a plan view of one embodiment of a wafer transport system according to the invention intended for unloading wafers from a magazine into a process station and reloading wafers therefrom into another magazine;

Figure 7:
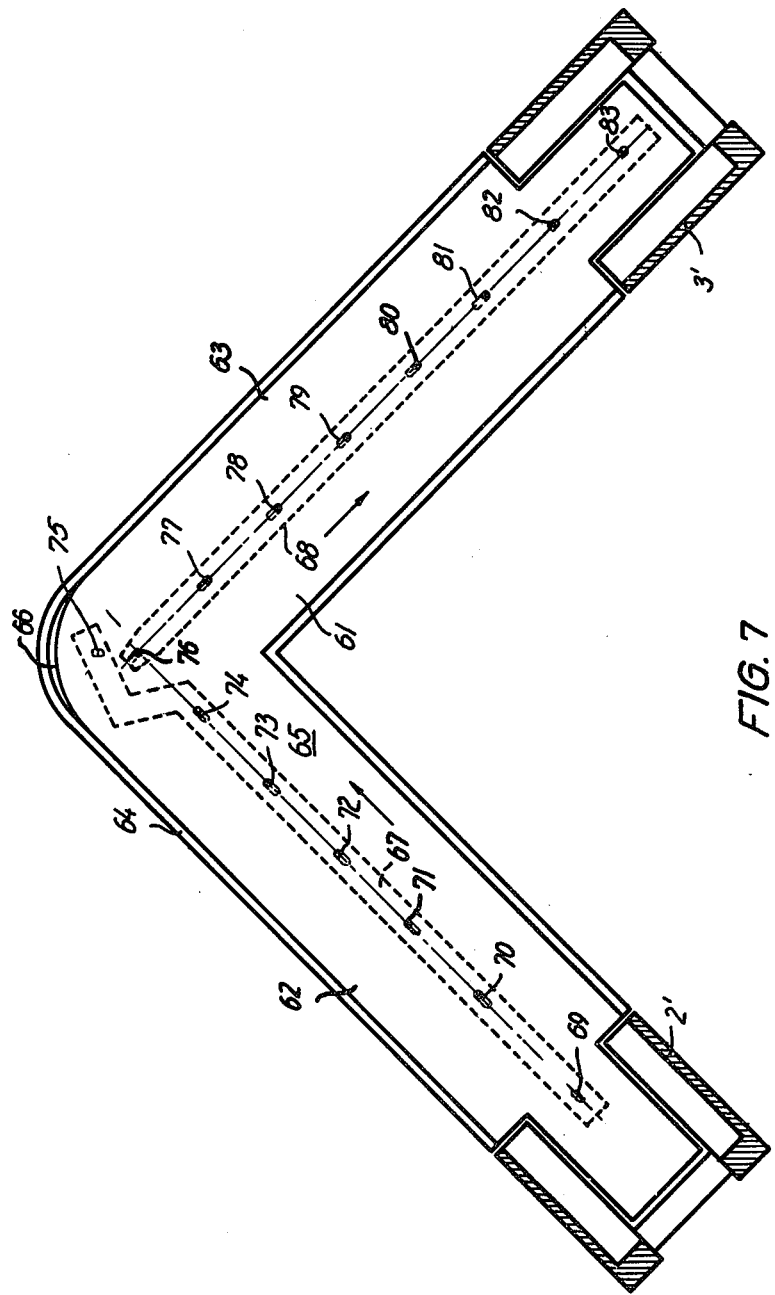

FIGS. 5 and 6 are a longitudinal sectional view and an underneath view, respectively, of another embodiment of a transport system according to the invention, in which two rail sections form together a continuous rail, on which wafers transported from a supply magazine to a receiving magazine are stopped in an intermediate position between said magazines; and FIG. 7 is an underneath view of an alternative form of the embodiment shown in FIGS. 5 and 6.

Figure 1:
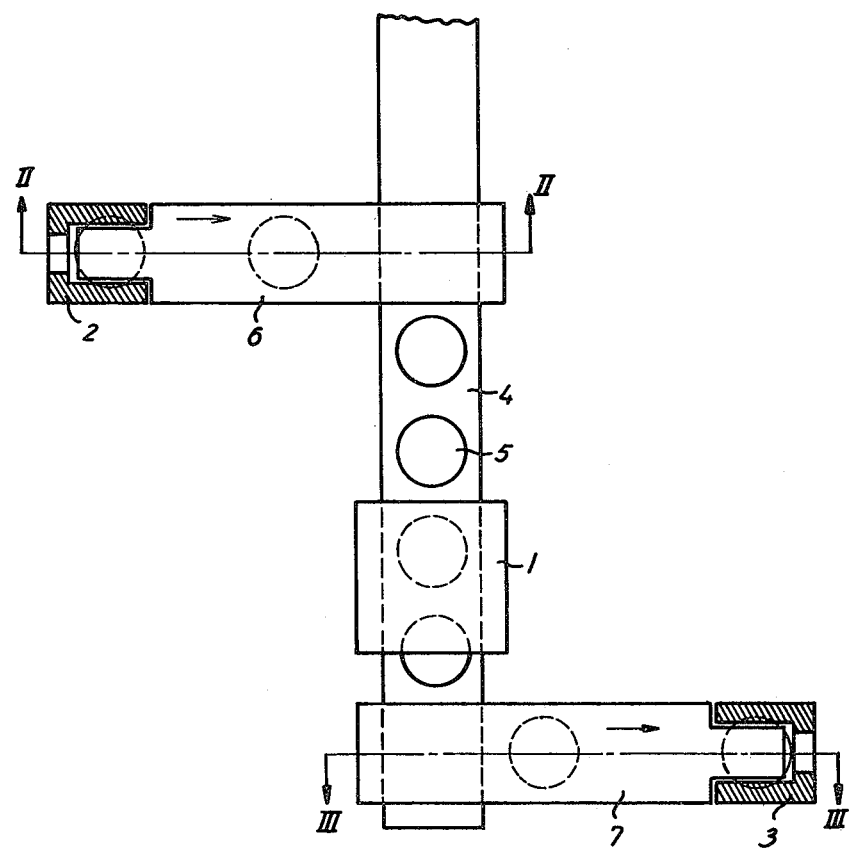

In FIG. 1 a part of a semiconductor production plant is illustrated in a purely schematical manner. In accordance with known technology, a great number of identical semiconductor components or -circuits are manufactured on a common substrate in the form of a so-called wafer, which may be a substantially circular silicium wafer of a small thickness and having a linear local cut at the circumferance thereof for determining the crystal orientation of the monolitic semiconductor wafer, said manufacture taking place through a number of process steps, only one of which is schematically illustrated in FIG. 1.

Thus, in a process station 1 in the part of the production plant shown in FIG. 1, the very vulnerable side of the wafers which has been coated with a thin film shall be subjected to a physical or chemical treatment, such as a chemical vapour deposition process. The wafers to be processed are positioned in a supply magazine 2 which may be of the standard type conventionally used for the storage of wafers and, subsequent to the treatment, the wafers shall be reloaded into a corresponding receiving magazine 3. In such magazines which with a view to the unloading and loading of wafers are open at their front side, the wafers are positioned in individual tracks separated by separation ribs, so that a suitable mutual spacing is maintained between the wafers.

In the technology hitherto employed, it has been necessary to use tweezers or tongs to transfer wafers from a supply magazine to a process station by unloading the wafers from the magazine to be positioned on a movable supporting surface in the form of a carriage or a conveyor belt, as shown at 4 in FIG. 1. Thereby, the very vulnerable wafers are subjected to mechanically handling which implies a major risk of destruction of the wafers and, for this reason, relatively great production losses have occurred in the use of this technology.

This risk of mechanical damage may be removed or considerably reduced by use of a method and a pick-up device as disclosed in the patent application referred to in the foregoing, by means of which wafers may be handled without physical contact. However, transfer of wafers from a magazine to a process station will still necessitate a time-consuming manual operation.

In the embodiment shown in FIG. 1 of a transport system according to the invention, the transfer of wafers from supply magazine 2 to the conveyor belt 4, known per se, by means of which the wafers, as illustrated at 5, are carried into the process station 1, as well as the further transfer of wafers subsequent to treatment in process station 1 from conveyor belt 4 to receiving magazine 3 may take place automatically without manual operations by use of the well known Bernouilli principle in transport rail sections 6 and 7, respectively, having a substantially flat suspension surface limited by lateral guide means for the wafer movement, in the interior of each of which rail sections a duct intended for connection to an air- or gas source is formed, said duct being connected with a number of inclined nozzles having an orientation in the desired direction of transportation, said nozzles terminating in orifices in the suspension surface of each rail section substantially along the longitudinal symmetry line of said suspension surface.

In the embodiment shown in FIG. 1, each of rail sections 6 and 7 is formed according to the invention without lateral guide means on part of its length extending from one end of the rail section for introduction to a prescribed depth into the supply magazine 2 and the receiving magazine 3, respectively.

The detailed construction of rail sections for use in a transport system according to the invention will appear from the following description of a few embodiments of such rail sections.

Figure 2:
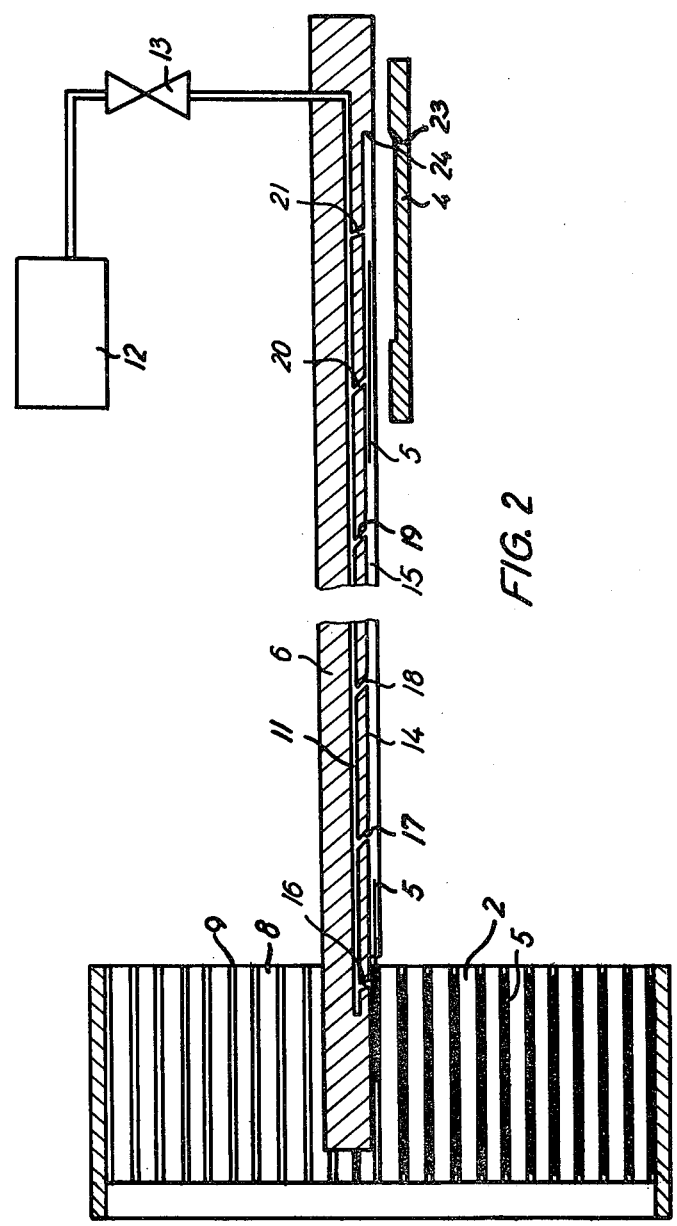
FIGS. 2 and 3 are longitudinal sectional views of rail sections incorporated in this embodiment of the transport system along the lines II—II and III—III, respectively, in FIG. 1.

In the longitudinal sectional view in FIG. 2, it is shown how wafers 5 are positioned in a number of individual tracks 9 separated by separation ribs 8 in the supply magazine 2. In the interior of rail section 6, a longitudinal duct 11 is formed, which in a manner illustrated purely schematically communicates with the surface of rail section 6 for connection to an air- or gas source 12 through a valve member 13. In the embodiment shown, the suspension surface for the wafers to be transported is formed by the underside 14 of rail section 6. For guidance of the wafer movement, the suspension surface 14 is laterally limited by lateral guide means in the form of longitudinal depending edge protrusions 15 from the underside of rail section 6, such as also shown in the underneath view in FIG. 4.

Figure 4:
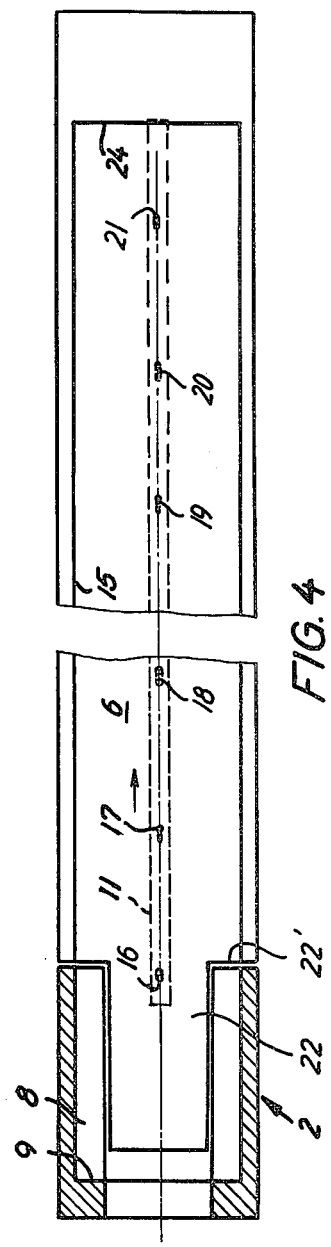
FIG. 4 is an underneath view of the rail section shown in FIG. 2.

The directional air- or gas flows necessary for wafer movement along a transport rail in accordance with Bernouilli's principle are produced in that a number of inclined nozzles 16 to 21 are connected to duct 11, all of said ducts having an orientation in accordance with the desired direction of transportation, which in this case is the direction away from the supply magazine 2, and the orifices of the nozzle being positioned in suspension surface 14 along the longitudinal symmetry line thereof, such as shown in FIG. 4.

With a view to introduction into the supply magazine 2, rail section 6 is formed in one end thereof with a tongue 22, which is not limited by lateral guide means and has a width somewhat smaller than the transverse spacing between opposite separating ribs 8 in magazine 2. At the junction of tongue 22 and the remaining length of rail section 6, a shoulder portion 22' is formed to form an abutment face for the front edges of opposite separation ribs 8 in the magazine, so as to limit the depth of introduction of the rail section into the magazine 2.

As shown in FIG. 2, the various nozzles 16 to 21 have different inclinations from ducts 11 down towards suspension surface 14 in that the axes of the nozzles form different angles with a normal to the plan of the suspension surface 14. This is based on the recognition of the fact that in different positions along the rail section, different requirements are put to the influence, to which the wafers 5 are to be subjected by the air- or gas flow ejected through the nozzles, and that said influence is primarily dependent on the inclination angle of the nozzles.

More particularly, the greater the inclination angle between a nozzle axis and a normal to the plan of the suspension surface is, the stronger will the influence be to provide a movement in the desired direction of transportation subject, however, to a certain decrease in the ability to attract a wafer upwardsly towards the suspension surface. Therefore, in the embodiment shown in FIGS. 1 to 4, in the central part of the rail section in which only transportation in the prescribed direction is desired, the inclinationangle between the axes of each of nozzles 17 to 20 and a normal to the plan of the suspension surface is relatively great, such as 45°, because in this part of the rail section 6, the wafers 5 have already been attracted to the level immediately below suspension surface 14, in which the movement takes place.

Different conditions prevail at the ends of rail section 6. At the end of the rail section introduced into the magazine 2, for example, it should be secured that the air- or gas flow ejected through the first nozzle 16 will not, subsequent to the passage of the underlying wafer 5 past the orifice of said nozzle, cause the following wafer 5 positioned in the next lower track of the magazine to be unloaded from the magazine. In order to achieve this, the orifice of nozzle 16 only is positioned in overlapping relationship to the wafers 5 in magazine 2, on one hand, and the axis of said nozzle forms such an inclination angle with a normal to the plan of suspension surface 14, on the other hand, that only the nearest wafer positioned in the track 9 immediately below suspension surface 14 is influenced by the air- or gas flow ejected through nozzle 16 in a region of the wafer, in which the air- or gas ejection will with certainty result in attraction of the wafer towards the suspension surface. Experiments have shown that such attraction will take place when the wafer is influenced by the air- or gas flow in a region, which for wafers of conventional diameter, such as 76 mm, extends a relatively short distance, such as 3 to 4 mm, internally of the wafer from the edge thereof at the front side of magazine 2. Therefore, nozzle 16 should be positioned and have an inclination angle so that the air ejected by this nozzle will preferably flow outside the front edge of the above mentioned following wafer 5 in the next track of magazine 2, or, in any circumstance, act upon this wafer in a distance from the front edge thereof, which does not exceed about 2 mm.

On the other hand, it is also required that as long as part of a wafer 5 is situated in a track 9 in magazine 2, the wafer should be maintained substantially parallel to the symmetry plan of said track in order to avoid tilting movement during unloading from magazine 2, which may cause damage to the wafer. In order to achieve this, a somewhat smaller inclination angle between the axis of the nozzle and a normal to the plan of the suspension surface will be required, such as 20°, as a result of which nozzle 16 in order to fulfil both of these requirements will have to be positioned at such a distance from the end of rail section 6 introduced into magazine 2 that the orifice of the nozzle is positioned a relatively short distance to the internal side of the front edge of the directly underlying wafer 5.

Another special condition exists in the opposite end of rail section 6, in which wafers 5 are to be positioned on the conveyer belt 4 shown in FIG. 1, said conveyer belt being formed for this purpose with recesses 23 adapted to receive wafers 5, since too high velocities in the wafer movement should be avoided in order that the wafers are not subjected to damage when abuting against stop means 24, which limits the suspension surface 14 of rail section 6 together with lateral guide means 15. Therefore, also the inclination angle between the axis of nozzle 21 and a normal to the plan of the suspension surface should preferably be elected to a somewhat smaller magnitude, such as 20°, with the additional result that a wafer 5 prior to being dumped onto conveyer belt 4 will be kept substantially parallel therewith, whereas greater inclination angles, such as 45°, will result in a downwards sloping of the forward edge of a wafer away from the suspension surface, such as illustrated in FIG. 2 for a wafer 5 during movement below the nozzle 20.

Considering the mutual spacing between nozzles 16 to 21, the major requirement is that in order to secure that the wafers to be transported are maintained in the desired level of movement immediately below suspension surface 14, said spacing is smaller than the smallest transverse dimension of the wafers. On the other hand, this spacing may not be too small, since then the nozzles may interfere with one another. Experiments have shown that the mutual spacing of the nozzles should preferably be between 40 and 90 percent of said smallest transverse dimension and may, for example, suitably amount to 75 percent thereof.

Figure 3:
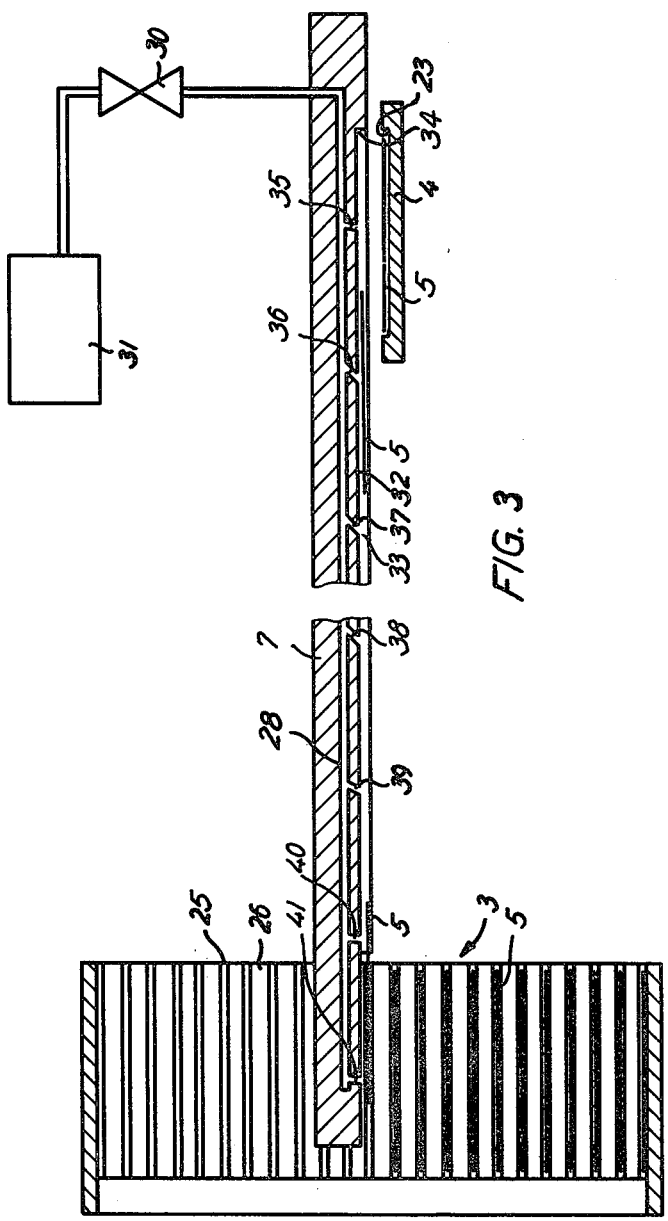

FIG. 3 is a longitudinal sectional view of the rail section 7 in the transport system shown in FIG. 1, by means of which wafers 5 are transferred from conveyer belt 4 to receiving magazine 3, in which the wafers are positioned in the same manner as for supply magazine 2 in individual tracks 23 separated by separation ribs 26. In the same manner as in rail section 6, a longitudinal duct 28 is formed in the interior of rail section 7, said duct being connected through a valve member 30 to an air- or gas source 31, and a suspension surface 32 being formed by the underside of rail section 7, which is limited by lateral guide means 33 and stop means 34. The end of rail sections 7 intended for introduction into receiving magazine 3 is formed in the same manner as the end of rail section 6 intended for introduction into supply magazine 2, such as shown in FIG. 4. The duct 28 is connected with a number of inclined nozzles 35 to 41, which, however, in rail section 7 have an orientation in the direction towards receiving magazine 3. With respect to the nozzles 36 to 39 positioned in the central part of rail section 7, in which only transportation in the desired direction towards receiving magazine 3 is aimed at, the inclination angle could be elected to the same value as in case of the corresponding nozzles in rail section 6, i.e. a value of 45°. However, also at the ends of rail section 7, particular conditions exist, as a result of which a smaller inclination angle between the nozzle axis and a normal to the plan of the suspension surface is required at these places relative to the above mentioned central part of the rail section.

Thus, the air- or gas flow ejected through nozzle 35 at the end of rail section 7 positioned above conveyer belt 4 should be sufficient for attracting the wafer 5 positioned on conveyer belt 4 upwardsly to a position immediately below suspension surface 32, which requires a relatively small inclination angle between the nozzle axis and a normal to the plan of the suspension surface, such as 10°. Moreover, at the opposite end of rail section 7, a suitably low velocity of the wafer movement should preferably be maintained in order to avoid damage of wafers 5 when entering into a track in receiving magazine 3 and, in addition, the wafers should be kept substantially parallel to suspension surface 32 and, thus, to the symmetry plan of the actual track in magazine 3. Therefore, in the embodiment shown in FIG. 3, the inclination angle between the axis of the two extreme nozzles 40 and 41 in this end of rail section 7 and a normal to the plan of the suspension surface is elected to a value of only 5°, and in order to secure the wafer to be maintained in the correct clearance relative to suspension surface 32, the spacing between the orifices of said two nozzles is elected to be somewhat smaller than the mutual spacing of the nozzle orifices in the remaining part of the rail section. Suitably, the spacing of the orifices of nozzles 40 and 41 may be elected to a value of 65 to 80 percent of the smallest transverse dimension of wafers 5 and, for example, 70 percent thereof, whereas the mutual spacing of the nozzle orifices in rail section 7 may, corresponding to rail section 6, be elected to a value of for example 75 percent of said smallest transverse dimension.

It will readily be understood that the embodiment shown in FIGS. 1 to 4 represents only one example of the construction of an automatical wafer transport system to be used in semiconductor manufacture by means of rail sections designed in accordance with the invention. Nothing could prevent the wafers from passing more than one process station between a supply magazine and a receiving magazine, since transportation between such process stations or conveyer belts associated therewith may be carried out by means of rail sections of a corresponding construction, in which, however, none of the ends of the rail sections need to be constructed for introduction into a magazine, because the wafers will only have to be transported from one flat suspension surface to another. Although in those cases it will be advantageous to use rail sections the suspension surface of which is formed by the underside, such as illustrated in FIGS. 2 and 3 in order to obtain the result aimed at when utilizing Bernouilli's principle that the vulnerable side of the wafer which should be accessible for treatment in a process station faces the transportation means so that the wafer can be positioned directly on a flat supporting surface with said vulnerable side facing upwardsly, nothing could in principle prevent the construction of rail sections in accordance with the invention with upwardly facing suspension surfaces. Such a construction may for example be applicable if a wafer is desired to be transferred from the end of a rail section which in the embodiment shown in FIGS. 1-4 is positioned above conveyer belt 4 to the corresponding end of another rail section constructed in accordance with the invention. Similarly, the suspension surfaces of the rail sections need not in principle be horizontal, but may even be nearly vertical if desired.

FIGS. 5 and 6 show a longitudinal sectional view and an underneath view respectively of an embodiment of a wafer transport system according to the invention in which two rail sections of the same principal construction as rail section 6 and 7 in FIGS. 2 and 3 form parts of a continuous rail 42 extending between a supply magazine 2' and a receiving magazine 3'. In the interior of each of these parts of rail 42 an individual duct 43 and 44, respectively, is formed which is connected through a valve member 45 and 46, respectively, to an air gas source 47 and 48, respectively, and is common to the nozzles in a nozzle set associated with the rail part in question. Also in this embodiment rail 42 is provided with a downwardsly facing suspension surface 49 limited by lateral guide means 50. The nozzle set associated with a first part of rail 42 which is introduced in supply magazine 2' comprises nozzles 51 to 54, whereas the nozzle set associated with the other part of rail 42, which is introduced into receiving magazine 3' comprises nozzles 55 to 59. With respect to the positions of said nozzles in rail 42, their mutual spacing and inclination angles the same conditions prevail as explained in the foregoing with reference to rail sections 6 and 7 in FIGS. 2 and 3. In order to make it possible to operate the two nozzle sets independant of each other ducts 43 and 44 overlap each other of the junction of the two rail parts at which it should be possible to stop the wafers 5 during their transport from magazine 2' towards magazine 3', such as clearly shown in FIG. 6. At this junction, rail 42 is provided with abutment members 60 to form stop means for the wafer movement in the desired intermediate position on rail 42. In the embodiment shown in FIGS. 5 and 6 said stop means is constructed as resilient pins extending through bores in rail 42 and being biased in the direction away from engagement with the paths of wafer movement, for example, by means of springs. By a suitable actuation not illustrated in the drawing, for example pneumatically, pins 60 may be depressed to stop the movement of the wafer transported from supply magazine 2' along suspension surface 49. When it is desired to carry on the wafer towards receiving magazine 3' pins 60 are deactuated, whereby the hindrance for further wafer movement along suspension surface 49 is removed.

The embodiment shown in FIGS. 5 and 6 is particularly suitable for transport systems in which a movable carriage is used for supporting wafers to be transferred to a process station, on which a wafer 5 is positioned subsequent to transport along the first part of rail 42 from supply magazine 2', said carriage being then moved into the process station and reciprocated to a position below rail 42 from which the wafer 5 may be transported furtheron along the suspension surface 49 of the rail towards receiving magazine 3'.

Finally, FIG. 7 shows an underneath view of an alternative form of a transport system having a continuous rail constructed from two rail sections according to the invention, said continuous rail being herein designated by 61. The rail parts 62 and 63 of rail 61 form in this embodiment an angle with each other of such a magnitude that stop means for the wafer movement from supply magazine 2' may be formed by the external lateral guide means 64 on the rail at the junction of the rail parts 62 and 63, i.e. at the apex of the angle between the rail parts. In order to reduce the risk of subjecting the wafer to damage a coating 66 of a suitable resilient material may be provided at this place on the side of lateral guide means 64 facing suspension surface 65.

In the same manner as in the embodiment shown in FIGS. 5 and 6 individual ducts 67 and 68 with associated nozzle sets 69 to 75 and 76 to 83 respectively are associated with rail parts 62 and 63 respectively in the embodiment shown in FIG. 7. With respect to the positions of the nozzles of these nozzle sets, their mutual spacing and inclination angles the same principal conditions prevail as mentioned in the foregoing and in the same manner as in the embodiment shown in FIGS. 5 and 6 the two nozzle sets may be actuated independant of each other from air or gas sources not shown in FIG. 7 in that duct 67 overlap the end of duct 68 at the junction between rail parts 62 and 63. Thereby the nozzle 75 in the nozzle set associated with duct 67 which is positioned at the junction of the two rail parts may be utilized to force a wafer 5 towards the stop means formed by lateral guide means 64. The inclination angle of the axis of this nozzle to a normal to the plan of the suspension surface should preferably be elected to the same value as for nozzle 55 in FIGS. 5 and 6, for example to 10°.

It will appear from the foregoing that the embodiments shown and described represent only examples of transport systems built up in accordance with the invention. Within the scope of the invention there will be a very great flexibility with respect to the construction of such transport systems, whereby a possibility is opened for authomatization of semiconductor production since the actuation of the air or gas sources serving to initiate transport along a rail section may without difficulty be authomatized according to known principles. Furthermore as a particular advantage a transport system according to the invention may in a manner known per se be operated with an inactive filtrated gas whereby the surface of the wafers will be protected against chemical attacks such as oxidation during transport as well as dust contamination.

What is claimed is:

1. A system for transporting disc-shaped wafers for use in semiconductor manufacture without physically contacting said wafers, by the use of Bernouilli's principle, comprising two rail sections, each having an underside which forms a substantially flat suspension surface limited by lateral guide means for the movement of said wafers, a longitudinal duct formed inside each rail section, a gas source connected with said duct having a number of inclined gas ejection nozzles extending between said duct and said suspension surface, the orifices of said nozzles being positioned substantially along the longitudinal symmetry line of said suspension surface and the axes of said nozzles having an orientation in said direction of transportation, one rail section being formed in one end for introduction to a prescribed depth into an open-front supply magazine for unloading wafers from individual tracks therein, and the other rail section being formed in one end for introduction to a prescribed depth into a receiving magazine for loading wafers thereinto, supporting means having an upwardly facing supporting surface arranged in a co-operative relationship with a spacing to the end of said rail sections remote from said one end to receive a wafer transported by said one rail section from said supply magazine, said other rail section having at least one nozzle positioned in an overlying relationship to said supporting surface, said nozzle inclined at an angle relative to a line perpendicular to the suspension surface of the other rail section to allow attraction of a wafer positioned on the supporting surface when a gas flow is ejected through said nozzle, said rail sections form parts of a continuous rail having individual sets of ejection nozzles for each such part, the nozzles of each of said nozzle sets being connected with an individual common duct in the interior of said rail, and stop means being provided in association with said supporting surface at the junction between said parts so as to protrude from said suspension surface for stopping the movement of wafers in the direction from said supply magazine to said receiving magazine.

2. A system as claimed in claim 1, wherein said continuous rail extends substantially rectilinearly between said supply and receiving magazines, said stop means being constructed to be retractable from the path of movement of the wafers, the individual ducts associated with each of said nozzle sets overlapping each other at the junction of said parts.

3. A system as claimed in claim 1, wherein said parts of the continuous rail form an angle with each other of such a magnitude that the external lateral guide means of the rail at the apex of said angle at the junction of said parts forms said stop means, the orifice of a nozzle of the nozzle set associated with the part of the rail introduced into the supply magazine being positioned at said junction, the axis of said nozzle having an orientation towards the stop means formed by said lateral guide means and the duct connected with said nozzle overlapping the duct of the other part of the rail at said junction.

* * * * *